United States Patent [19]
Voorman et al.

[11] Patent Number: 5,952,880
[45] Date of Patent: Sep. 14, 1999

[54] VARIABLE-GAIN AMPLIFIER WITH PSEUDO-LOGARITHMIC GAIN CONTROL FOR GENERATING TWO CONTROL CURRENTS

[75] Inventors: Johannes O. Voorman; H. Veenstra, both of Eindhoven, Netherlands

[73] Assignee: U.S. Philips Corporation, New York, N.Y.

[21] Appl. No.: 08/869,911

[22] Filed: Jun. 5, 1997

[30] Foreign Application Priority Data

Jun. 21, 1996 [EP] European Pat. Off. .............. 96201725

[51] Int. Cl.[6] ...................................... H03F 3/45
[52] U.S. Cl. ........................................ 330/254; 327/359
[58] Field of Search .................. 330/252, 254, 330/261, 279; 327/359

[56] References Cited

U.S. PATENT DOCUMENTS

| | | | |
|---|---|---|---|
| 3,849,735 | 11/1974 | Haenen et al. | 330/30 |
| 5,256,984 | 10/1993 | Lee | 330/254 |
| 5,389,893 | 2/1995 | Itri et al. | 330/254 |

FOREIGN PATENT DOCUMENTS

0582365A1  9/1994  European Pat. Off. .

OTHER PUBLICATIONS

"A New Wide–Band Amplifier Technique", Barrie Gilbert, Member, IEEE, Journal of Solid–State Circuits, vol. SC–3, No. 4, Dec. 1968.

*Primary Examiner*—Steven J. Mottola
*Attorney, Agent, or Firm*—Steven R. Biren

[57] ABSTRACT

Control circuit for generating two control currents for a variable gain amplifier having a gain which is substantially proportional to the ratio of the two control currents. For a gain control which is independent of the signal level of the variable gain amplifier an exponential control characteristic is needed. The control circuit generates a set of control currents $2*I$ and $2*J$ with a ratio which is pseudo-exponential dependent on the control parameter $u_c$. The ideal exponential characteristic is approximated to with a second-order function of the type $((1+x)/(1-x))^2$ by means of a voltage-to-current converter, a first translinear loop and a second translinear loop.

9 Claims, 3 Drawing Sheets

VARIABLE-GAIN AMPLIFIER WITH PSEUDO-LOGARITHMIC GAIN CONTROL FOR GENERATING TWO CONTROL CURRENTS

BACKGROUND OF THE INVENTION

The invention relates to a control circuit for generating two control currents for a variable gain amplifier having a gain which is substantially proportional to the ratio of the two control currents. Variable gain amplifiers (VGA) with a gain proportional to the ratio of two currents are known from European Patent Application 0 582 365, which shows techniques known from U.S. Pat. No. 3,849,735, which in turn shows techniques known from a paper by B. Gilbert, "A New Wide-Band Amplifier Technique", IEEE Journal of Solid-Sate Circuits, Vol. SC-3, No. 4, Dec. 1968, p. 353–365. Such variable gain amplifiers exhibit a large bandwidth and can be used, for example, in read amplifiers for hard disk drives in which a variable gain is needed to compensate for the fluctuating output signal of the read head. For this purpose an automatic gain control (AGC) loop is incorporated in the signal processing chain in order to have a constant signal level. In order to get an AGC performance which is independent of the level of the input signal, an exponential VGA control is needed, i.e. the gain should be proportional to exp(x), where x is the control parameter. This means that the ratio of the two control currents for the VGA should be exponentially proportional to the control parameter.

SUMMARY OF THE INVENTION

It is an object of the invention to provide a control circuit for supplying control currents having a ratio substantially exponentially proportional to a control parameter. According to the invention there is provided a control circuit characterized in that the control circuit comprises: input terminals for receiving a control signal; output terminals for supplying the two control currents; a voltage-to-current converter for converting the control signal at the input terminals into differential output currents, the voltage-to-current converter having two output nodes for supplying the differential output currents; a first string of at least two semiconductor junctions arranged in series between one of the two output nodes and a reference terminal; a second string of at least two semiconductor junctions arranged in series between the other one of the two output nodes and the reference terminal; a differential transistor pair having interconnected emitters coupled to the reference terminal through current conduction means, having respective bases connected to the two output nodes and having respective collectors coupled to the output terminals.

The first string of at least two semiconductor junctions, the base-emitter junctions of the two transistors of the differential transistor pair and the second string of at least two semiconductor junctions form a translinear loop. The differential output currents from the voltage-to-current converter are fed to the first and second strings of at least two semiconductor junctions. The result is that the collector currents of the transistors of the differential pair, as will be shown hereinafter, have a ratio in accordance with an at least second-order approximation to the desired exponential control, which approximation is accurate over a wide signal level range. Advantageous embodiments are defined in the dependent claims.

BRIEF DESCRIPTION OF THE DRAWINGS

The above and other objects and features of the present invention will become more apparent from the following detailed description considered in connection with the accompanying drawings which.

DESCRIPTION OF THE PREFERRED EMBODIMENTS

Figure 1:
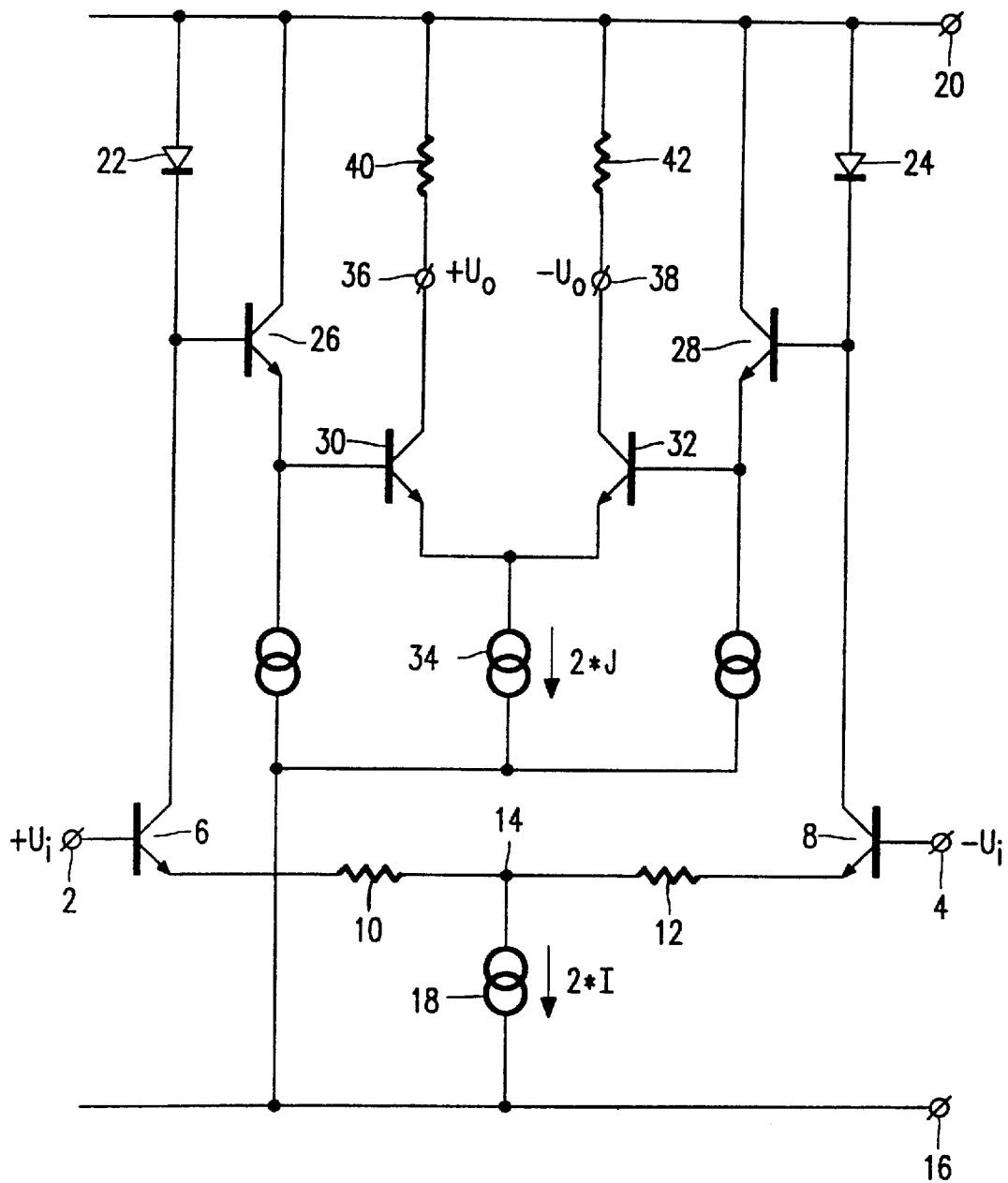
FIG. 1 shows a variable gain amplifier with a gain proportional to the ratio of two control currents.

FIG. 1 shows a Variable Gain Amplifier (VGA) based on the afore-mentioned patent documents and article by B. Gilbert, the contents of which are herewith incorporated by reference. A differential input signal $+u_i$ at input terminal 2 and $--u_i$ at input terminal 4 is converted to a differential current by means of a transistor 6 and a transistor 8, the emitters of which are interconnected via two series resistors 10 and 12. The interconnection node 14 of the two series resistors 10 and 12 is coupled to a negative supply terminal 16 via a first control current source 18 which generates a first control current 2*I. The bases of the transistors 6 and 8 are coupled to the input terminals 2 and 4, respectively. The collectors of the transistors 6 and 8 are connected to a positive supply terminal 20 via a diode 22 and a diode 24, respectively. These diodes 22 and 24 may be replaced by diode connected transistors. The voltages across the diodes 22 and 24 are buffered by emitter follower transistors 26 and 28, respectively, in a fashion and for reasons disclosed extensively in afore-mentioned U.S. Pat. No. 3,849,735, but these emitter followers may be omitted when desired. The buffered voltages are supplied to respective bases of transistors 30 and 32, the emitters of which are interconnected and coupled to the negative supply terminal 16 via a second control current source 34 which generates a second control current 2*J. The collectors of the transistors 30 and 32 are coupled to respective output terminals 36 and 38 of the VGA, which output terminals, by way of example, are connected to the positive supply terminal 20 via respective load resistors 40 and 42 for generating a complementary amplified output signal $+u_o/-_o$. The gain $u_o/u_i$ of the VGA is substantially proportional to the ratio J/I of the control currents generated by the control current sources 34 and 18, as extensively explained in the afore-mentioned article by B. Gilbert. When desired the emitters of the transistors 6 and 8 can be selectively interconnected by additional resistors to reduce the gain of the VGA in steps.

The VGA shown in FIG. 1 is particularly suitable for use as a wide-band variable-gain signal amplifier in an automatic gain control (AGC) loop in the read amplifier in hard disk drives. For this purpose an AGC performance is needed which is independent of the signal level of the input signal $u_i$. The VGA control then should be exponentially dependent on a control parameter x. In other words, the gain $u_o/u_i$ should be proportional to exp(x), where x is the control parameter. This means that the ratio J/I of the two control currents for the VGA should be exponentially proportional to the control parameter x.

Figure 2:
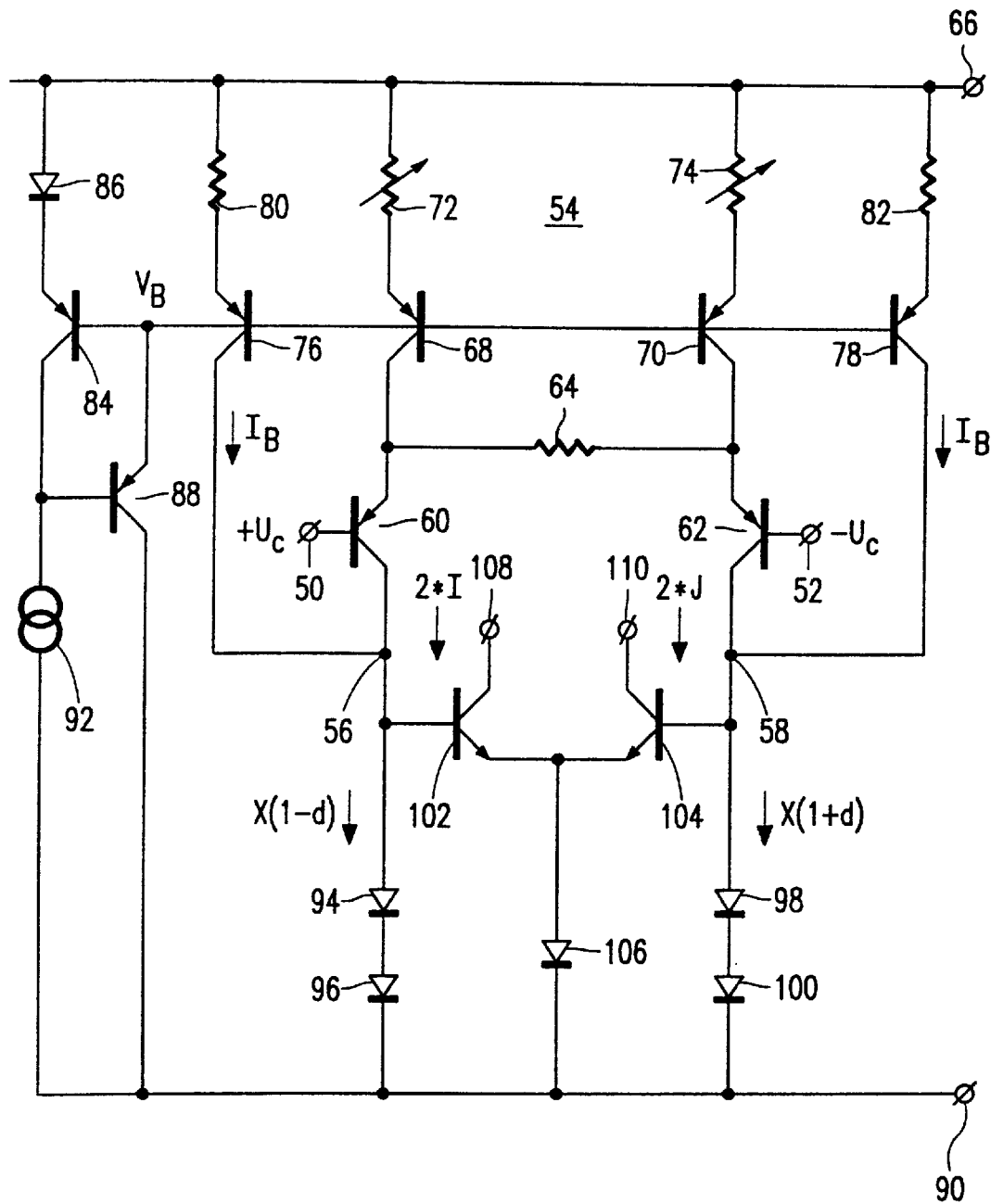
FIG. 2 shows a control circuit according to the invention for generating control currents for the variable gain amplifier of FIG. 1.

FIG. 2 shows a circuit according to the invention, which circuit is capable of supplying two control currents fulfilling this requirement. The exponential relationship exp(2n*x) is approximated to by the relation: $((1+x)/(1-x))^n$, where x is the normalized control voltage and n is an integer. By using this approximation a pseudo exponential control characteristic is obtained. A second-order approximation, i.e. n=2 is sufficient for a control range of about 30 dB deviating not more than 2 dB from an ideal exponential characteristic. The control circuit has input terminals 50 and 52 which receive, by way of example, a differential control voltage $+u_c/-u_c$. This differential control voltage is converted to a differential current by means of a voltage-to-current converter 54, which differential current is available at two output nodes 56 and 58 of the voltage-to-current converter 54. The voltage-to-current converter 54 can be of any suitable design. By way of example, the voltage-to-current converter 54 comprises a differential transistor pair consisting of a PNP transistor 60, which has its base or control electrode connected to input terminal 50, and a PNP transistor 62, which has its base connected to input terminal 52. The emitters or first main electrodes of the transistors 60 and 62 are connected through a resistor 64, which determines the sensitivity of the voltage-to-current converter 54. The emitters of the transistors 60 and 62 are coupled to a positive supply terminal 66 via respective bias current sources, comprising, by way of example, PNP current source transistors 68 and 70, respectively. The emitters of the current source transistors 68 and 70 are connected to the positive supply terminal 66 via respective bias resistors 72 and 74, which may be made adjustable to preset the gain of the VGA shown in FIG. 1. The voltage-to-current converter 54 further comprises two DC bias current sources for supplying a bias current $I_B$ to the output nodes 56 and 58. The two bias current sources are, by way of example, implemented with PNP current source transistors 76 and 78, respectively. The emitters of the current source transistors 76 and 78 are connected to the positive supply terminal 66 via respective bias resistors 80 and 82. The bases of the current source transistors 68, 70, 76 and 78 are all connected to the base of a PNP transistor 84, which has its emitter connected to the positive supply terminal 66 via a diode 86. The voltage difference between the base and collector or second main electrode of the transistor 84 is kept constant by means of a PNP transistor 88, which has its emitter, base and collector connected to, respectively, the base and the collector of transistor 84 and a negative supply terminal 90. The collector of transistor 84 is coupled to the negative supply terminal 90 via a bias current source 92. In this way a bias voltage $V_B$ is available at the base of transistor 84, which voltage is distributed to the bases of current source transistors 68, 70, 76 and 78.

The control circuit further comprises a first string of two diodes 94 and 96 connected in series between the output node 56 and the negative supply terminal 90 and a second string of two diodes 98 and 100 connected in series between the output node 58 and the negative supply terminal 90. In addition a differential transistor pair comprises an NPN transistor 102 and an NPN transistor 104, whose emitters are interconnected and connected to the negative supply terminal 90 via a further diode 106. The diodes 94, 96, 98, 100 and 106 are preferably diode-connected bipolar NPN transistors. The base and collector of transistor 102 are connected to the output node 56 and a first output terminal 108 of the control circuit, respectively. The base and collector of transistor 104 are connected to the output node 58 and a second output terminal 110 of the control circuit, respectively. At output terminal 108 the first control current 2*I is available and should be applied to the interconnection node 14 of the VGA in FIG. 1. At output terminal 110 the second control current 2*J is available and should be applied to the interconnection node of the emitters of the transistors 30 and 32 of the VGA in FIG. 1. In that case, the positive supply terminals and the negative supply terminals of the VGA of FIG. 1 and the control circuit of FIG. 2 may be intercon-nected to simplify the power supply. The emitter areas of the diode-connected transistors 94, 96, 98 and 100 are substantially equal. The emitter areas of the transistors 102 and 104 are, by way of example, twice as large, and the emitter area of diode-connected transistor 106 is, again by way of example, four times as large as the emitter areas of the diode-connected transistors 94, 96, 98 and 100. However, other area ratios may be chosen as well. The semiconductor junctions of the diodes 94, 96, 106 and the transistor 102 form a first translinear loop. The semiconductor junctions of the diodes 98, 100, 106 and the transistor 104 form a second translinear loop. The translinear principle per se is known from, for example, Chapter 2 of the book: "Analogue IC design: the current-mode approach", Peter Peregrinus Ltd., London, UK, 1990.

The voltage-to-current converter 54 generates at output node 56 a current X(1−d) and at output node 58 a current X(1+d), d being proportional to the control voltage $U_c$ as well as to the preset value of the bias resistors 72 and 74. Assuming, for example, that $I_B$=0.5 mA and the collector current of transistor 60 is variable between 0 and 1 mA and the collector current of transistor 62 variable between 1 and 0 mA in response to the control voltage $u_c$, the current X(1−d) varies between 0.5 mA<X(1−d)<1.5 mA. Hence, −0.5<d<+0.5. The current X(1−d) flows through the semiconductor junctions of the two diodes 94 and 96. The current X(1+d) flows through the semiconductor junctions of the diodes 98 and 100. The current 2*I flows through the base-emitter junction of transistor 102 and through the semiconductor junction of diode 106. The current 2*J flows through the base-emitter junction of transistor 104 and through the semiconductor junction of diode 106. Thus, the total current through diode 106 is 2*I+2*J. The sum of the semiconductor junction voltages of diodes 94 and 96 is equal to the sum of the semiconductor junction voltages of transistor 102 and diode 106. The same holds for the sum of the semiconductor junction voltages of diodes 98 and 100 and the sum of the semiconductor junction voltages of transistor 104 and diode 106. Therefore, taking into account the above mentioned emitter area ratios and according to the translinear principle, which is based on the well-known logarithmic relationship between the junction voltage and the junction current, the following applies:

$$X(1-d)*X(1-d)=2*I/2*(2*I+2*J)/4=I*(I+J)/2 \qquad (1)$$

$$X(1+d)*X(1+d)=2*J/2*(2*I+2*J)/4=J*(I+J)/2 \qquad (2)$$

Division of equation (2) by equation (1) yields:

$$J/I=((1+d)/(1-d))^2 \qquad (3)$$

This means that the ratio of the two control currents is in accordance with the above mentioned second-order approximation of the exponential control characteristic.

In the table below the second-order pseudo-exponential gain function Gps=20 log $((1+x)/(1-x))^2$ is compared with a true exponential gain function Gex=20 log exp(4x) and the difference Dif between Gps and Gex is computed for 0<abs (x)<0.5:

| x | Gps (dB) | Gex (dB) | Dif (dB) |
|---|---|---|---|
| 0.0 | 0 | 0 | 0.00 |
| 0.1 | 3.49 | 3.47 | 0.02 |
| 0.2 | 7.04 | 6.95 | 0.09 |
| 0.3 | 10.75 | 10.42 | 0.33 |

| x | Gps (dB) | Gex (dB) | Dif (dB) |
|---|---|---|---|
| 0.4 | 14.72 | 13.90 | 0.83 |
| 0.5 | 19.08 | 17.37 | 1.71 |

The Table shows that a good approximation of the ideal exponential gain control over a large control range is achieved by the second-order pseudo-exponential control characteristic of the control circuit according to the invention.

Figure 3:
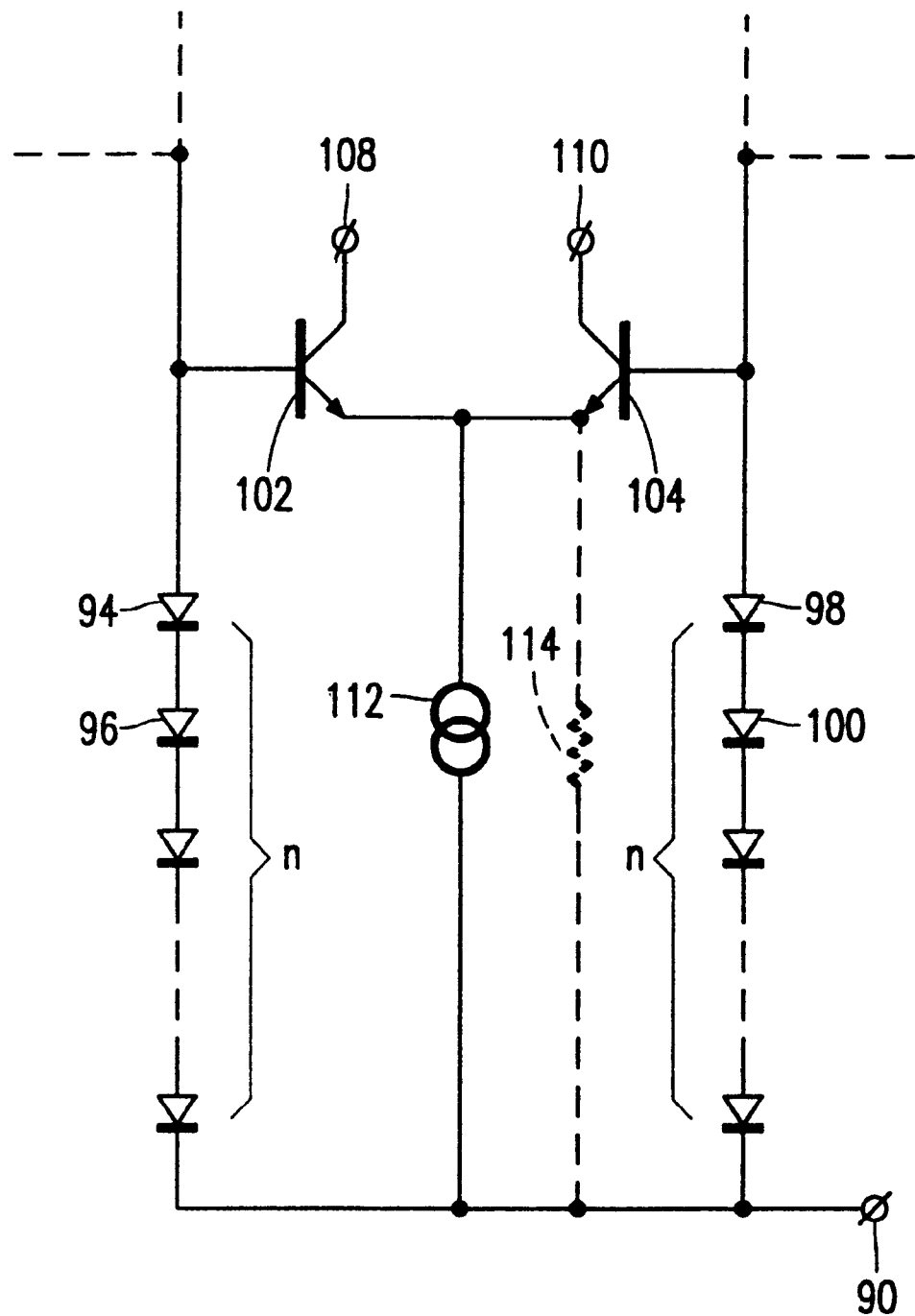
FIG. 3 shows a part of an alternative embodiment of the control circuit of FIG. 2.

The diode 106 may be replaced by a string of diodes. The diode 106 may also be replaced by a current source 112 or a resistor 114 as shown in FIG. 3. The basic translinear principles remain valid and equations similar to equations (1), (2) and (3) above can be derived for this configuration. As is also shown in FIG. 3, the number of diodes in each string of diodes may be greater than two in order to obtain a higher-order approximation of the exponential function.

The embodiments of the present invention described herein are intended to be taken in an illustrative and not a limiting sense. Various modifications may be made to these embodiments by persons skilled in the art without departing from the scope of the present invention as defined in the appended claims. For example, the transistors in the voltage-to-current converter 54 can be unipolar (MOS) transistors with a source, drain and gate which correspond to the emitter (first main electrode), collector (second main electrode) and base (control electrode). In fact, as stated before, any voltage-to-current converter 54 capable of generating differential currents of the type X(1−d), X(1+d) in response of the control signal $u_c$ is suitable for use in the control circuit.

We claim:

1. A control circuit for generating two control currents for a variable gain amplifier having a gain which is substantially proportional to the ratio of the two control currents, characterized in that the control circuit comprises: input terminals (50, 52) for receiving a control signal; output terminals (108, 110) for supplying the two control currents; a voltage-to-current converter (54) for converting the control signal at the input terminals (50, 52) into differential output currents, the voltage-to-current converter (54) having two output nodes (56, 58) for supplying the differential output currents;

a first string of at least two semiconductor junctions (94, 96) arranged in series between one (56) of the two output nodes and a reference terminal (90); a second string of at least two semiconductor junctions (98, 100) arranged in series between the other one (58) of the two output nodes and the reference terminal (90);

a differential transistor pair (102, 104) having interconnected emitters coupled to the reference terminal (90) through current conduction means (112, 106), having respective bases connected to the two output nodes (56, 58) and having respective collectors coupled to the output terminals (108, 110);

wherein the voltage-to-current converter (54) comprises: first bias current means (68, 70); a further differential transistor pair comprising transistors (60, 62) having respective first main electrodes coupled to the first bias current means (68, 70) for receiving bias current, having respective control electrodes coupled to the input terminals (50, 52) and having respective second main electrodes coupled to respective ones of the two output nodes (56, 58); and wherein the first bias current means (68, 70) comprises first (68) and second (70) current source transistors having respective control electrodes connected for receiving a bias voltage, and having respective main current paths inserted between a further reference terminal (66) and the respective first main electrodes of the transistors (60, 62) of the further differential transistor pair.

2. A control circuit as claimed in claim 1, wherein the current conduction means comprises at least one further semiconductor junction (106).

3. A control circuit as claimed in claim 1, wherein the current conduction means comprises a current source (112) or a resistor (114).

4. A control circuit as claimed in claim 1, wherein the voltage-to-current converter (54) further comprises a resistor (64) coupled between the first main electrodes of the transistors (60, 62) of the first differential transistor pair.

5. A control circuit as claimed in claim 1, wherein the main current paths of the first (68) and second (70) current source transistors are coupled to the further reference terminal (66) via a first (72) and a second (74) bias resistor, respectively.

6. A control circuit as claimed in claim 5, wherein the first and second bias resistors (72, 74) are adjustable.

7. A control circuit as claimed in claim 1, wherein the voltage-to-current converter (54) further comprises second bias current means (76, 78) for supplying respective bias currents to the two output nodes (56, 58).

8. A control circuit as claimed in claim 7, wherein the second bias current means (76, 78) comprises third (76) and fourth (78) current source transistors having respective control electrodes connected for receiving a bias voltage, and having respective main current paths inserted between the further reference terminal (66) and the two output nodes (56, 58).

9. A control circuit as claimed in claim 8, wherein the main current paths of the third (76) and fourth (78) current source transistors are coupled to the further reference terminal (66) via a third (80) and a fourth (82) bias resistor, respectively.

* * * * *